United States Patent
Asano et al.

(10) Patent No.: US 8,420,422 B2
(45) Date of Patent: Apr. 16, 2013

(54) PATTERN FORMING METHOD, PROCESSING METHOD, AND PROCESSING APPARATUS

(75) Inventors: Masafumi Asano, Kanagawa (JP); Ryoichi Inanami, Kanagawa (JP); Masayuki Hatano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/041,917

(22) Filed: Mar. 7, 2011

(65) Prior Publication Data
US 2011/0229988 A1    Sep. 22, 2011

(30) Foreign Application Priority Data

Mar. 19, 2010   (JP) .................. 2010-064916

(51) Int. Cl.
*H01L 21/00*   (2006.01)
(52) U.S. Cl.
USPC ............... 438/39; 438/14; 257/E21.525
(58) Field of Classification Search ........... 257/E21.536
See application file for complete search history.

(56) References Cited

U.S. PATENT DOCUMENTS

| 2008/0187719 A1 | 8/2008 | Uchida |
| 2009/0023288 A1* | 1/2009 | Jeong et al. ............... 438/670 |
| 2011/0272382 A1 | 11/2011 | Owa et al. |

FOREIGN PATENT DOCUMENTS

| JP | 2006-140382 | 6/2006 |
| JP | 2007-296783 | 11/2007 |
| JP | 2008-126450 | 6/2008 |
| WO | WO 2009/153926 | 12/2009 |

OTHER PUBLICATIONS

Notice of Rejection mailed by the Japanese Patent Office on Jun. 19, 2012, for Japanese Patent Application No. 2010-064916, and English-language translation thereof.

* cited by examiner

*Primary Examiner* — Cheung Lee
(74) *Attorney, Agent, or Firm* — Finnegan, Henderson, Farabow, Garrett & Dunner, L.L.P.

(57) ABSTRACT

According to the embodiments, a distribution of a recess portion shape is calculated based on a result obtained by measuring the recess portion shape of a first projection and recess pattern formed on a surface of a template. Next, a distribution of an application amount of a curing agent to a processing target layer is calculated based on the distribution of the recess portion shape, and the curing agent is applied to the processing target layer based on this distribution of the application amount of the curing agent. Next, a second projection and recess pattern is formed by transferring the first projection and recess pattern onto the curing agent by causing the curing agent to cure in a state where the first projection and recess pattern is in contact with the curing agent.

3 Claims, 10 Drawing Sheets

PATTERN DIMENSION (GROOVE WIDTH)
NARROW ⟵ WIDE ⟶ NARROW (UPPER RIGHT)

(LOWER LEFT)

(UPPER RIGHT)

(LOWER LEFT)

PATTERN FORMING METHOD, PROCESSING METHOD, AND PROCESSING APPARATUS

CROSS-REFERENCE TO RELATED APPLICATIONS

This application is based upon and claims the benefit of priority from Japanese Patent Application No. 2010-64916, filed on Mar. 19, 2010; the entire contents of which are incorporated herein by reference.

FIELD

Embodiments described herein relate generally to a pattern forming method, a processing method, and a processing apparatus.

BACKGROUND

As a method of forming a fine structure in a manufacturing process of a semiconductor, a nanoimprint lithography (NIL) is used. The NIL is a technology of transferring a pattern onto resist by bringing a unit-magnification template (hereinafter, template) on which a fine pattern that is the same size as a feature size is formed by an electron beam (EB) exposure or the like into contact with a process target substrate to which the resist is applied.

In such pattern formation by the NIL, resist remains in a recess portion (corresponding to a projection portion of the template) of a resist pattern on the process target substrate. The film thickness of this residual portion of the resist is typically called Residual Layer Thickness (RLT), which is an evaluation index of process stability in the NIL.

After the NIL, a pattern is formed on the process target substrate by etching the process target substrate with the resist pattern formed by the NIL as a mask. As above, because resist remains also in the recess portion of the resist pattern, an etching condition needs to be determined by taking it also into account. In other words, even if the dimension of the resist pattern is finished uniformly, the pattern dimension of the processed process target substrate may vary due to variation in RLT.

Moreover, in the NIL, a pattern formed on the template is transferred onto resist in the same size. Therefore, accuracy in pattern in the template greatly affects variation in final feature size of the process target substrate. Illumination unevenness and effect of aberration also affect the dimension variation in a shot in a normal photolithography in addition to an error in a photomask dimension. However, in the NIL, it can be said that most of the dimension variation in a shot is due to the dimension variation of the template.

On the other hand, a manufacturing accuracy is extremely severe in the template for the NIL compared to a quadruple photomask used in the normal photolithography. Typically, the photomask and the template are manufactured by using an electron beam lithography. For example, when a line and space (L/S) of 50 nm pitch is needed on a wafer, an L/S pattern of 200 nm pitch is manufactured on the quadruple photomask. However, on the template for the NIL, an L/S pattern of 50 nm pitch that is the same as an actual feature size is manufactured. Therefore, the manufacturing accuracy is severe in the unit-magnification template for the NIL compared to the quadruple photomask, so that variation in pattern dimension easily occurs.

As a technology to address a problem attributed to the dimension variation of the template, for example, Japanese Patent Application Laid-open No. 2007-296783 proposes a method of applying resist so that the distance between a mold and a substrate in a pressing process becomes uniform in accordance with the shape and the thickness distribution of the mold (template) and the process target substrate. With this method, it is possible to shorten the time required for the pressing process by preventing increase in pressing time attributed to flatness such as thickness, undulation, or the like of the mold and the process target substrate, so that throughput can be improved.

DETAILED DESCRIPTION

In general, according to one embodiment, a distribution of a recess portion shape is calculated based on a result obtained by measuring the recess portion shape of a first projection and recess pattern formed on a surface of a template. Next, a distribution of an application amount of a curing agent to a processing target layer is calculated based on the distribution of the recess portion shape, and the curing agent is applied to the processing target layer based on this distribution of the application amount of the curing agent. Next, a second projection and recess pattern is formed by transferring the first projection and recess pattern onto the curing agent by causing the curing agent to cure in a state where the first projection and recess pattern is in contact with the curing agent.

It is found out through the study by the inventors that the technology in Japanese Patent Application Laid-Open No. 2007-296783 is based on the premise that a pattern is formed on the template with a uniform dimension and therefore cannot deal with the case where the pattern dimension on the template varies, and thus variation in final feature size due to the variation in pattern dimension on the template cannot be prevented.

A pattern forming method, a processing method, and a processing apparatus according to the embodiments will be explained below in detail with reference to the accompanying drawings. The present invention is not limited to these embodiments. In the following drawings, the scale of each member is different from a realistic one in some cases for easy understanding. The same thing can be said between the drawings.

(First Embodiment)

Figure 1A:
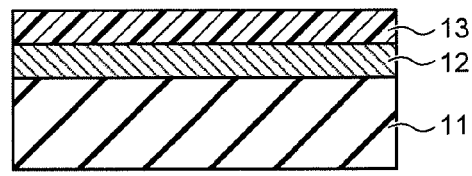
FIG. 1A to FIG. 1F are cross-sectional views illustrating one example of a manufacturing method of a template.

In the following, a process of a nanoimprint lithography (NIL) according to the first embodiment is explained. First, a template substrate (hereinafter, template) used in the NIL is manufactured. FIG. 1A to FIG. 1F are cross-sectional views illustrating one example of a manufacturing method of the template. First, a chrome (Cr) film 12 is formed on the whole surface of, for example, an approximately rectangular quartz substrate 11 and resist 13 is applied to the chrome film 12 (FIG. 1A).

Figure 1B:
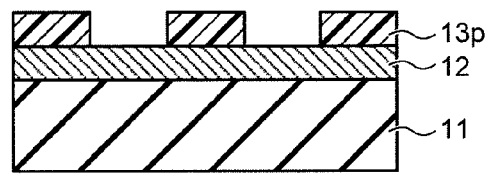
Figure 1C:
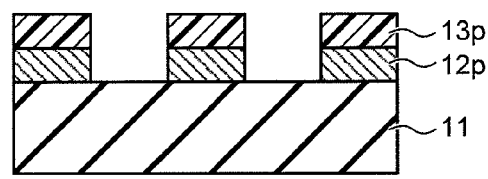

Next, an electron beam (EB) writing is performed on the resist 13 by an L/S pattern of, for example, 50 nm pitch, and thereafter a development process is performed. Consequently, an L/S resist pattern 13p of 50 nm pitch is formed on the chrome film 12 (FIG. 1B).

Figure 1D:
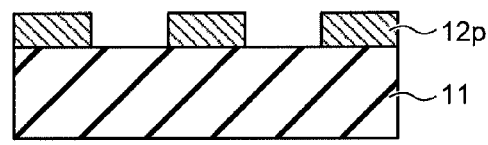

Next, an anisotropic etching is performed on the chrome film 12 with the resist pattern 13p as an etching mask (FIG. 1C), and thereafter the resist pattern 13p is stripped (FIG. 1D). Consequently, a Cr film pattern 12p on which the pattern of the resist pattern 13p is transferred is formed on the quartz substrate 11.

Figure 1E:
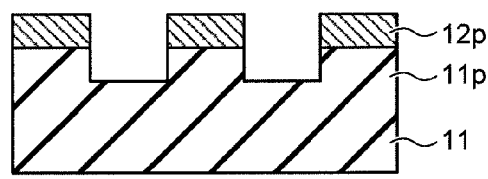

Next, the anisotropic etching is performed on the quartz substrate 11 with the Cr film pattern 12p as an etching mask. Consequently, an L/S projection and recess pattern 11p of 50 nm pitch on which the pattern of the Cr film pattern 12p is transferred is formed on the surface of the quartz substrate 11 (FIG. 1E).

Figure 1F:
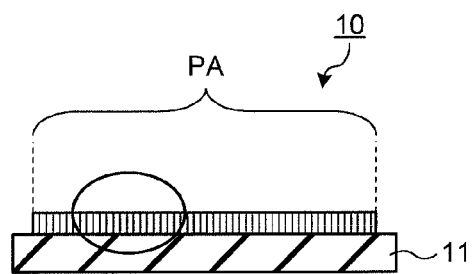

Next, after stripping the Cr film pattern 12p, an outside area of a pattern area PA in which the pattern of the projection and recess pattern 11p is formed is engraved on one surface side of the quartz substrate 11, whereby a template 10 for nanoimprint is completed (FIG. 1F). FIG. 1A to FIG. 15 illustrate part of the pattern area PA in FIG. 1F in an enlarged manner.

Figure 2:
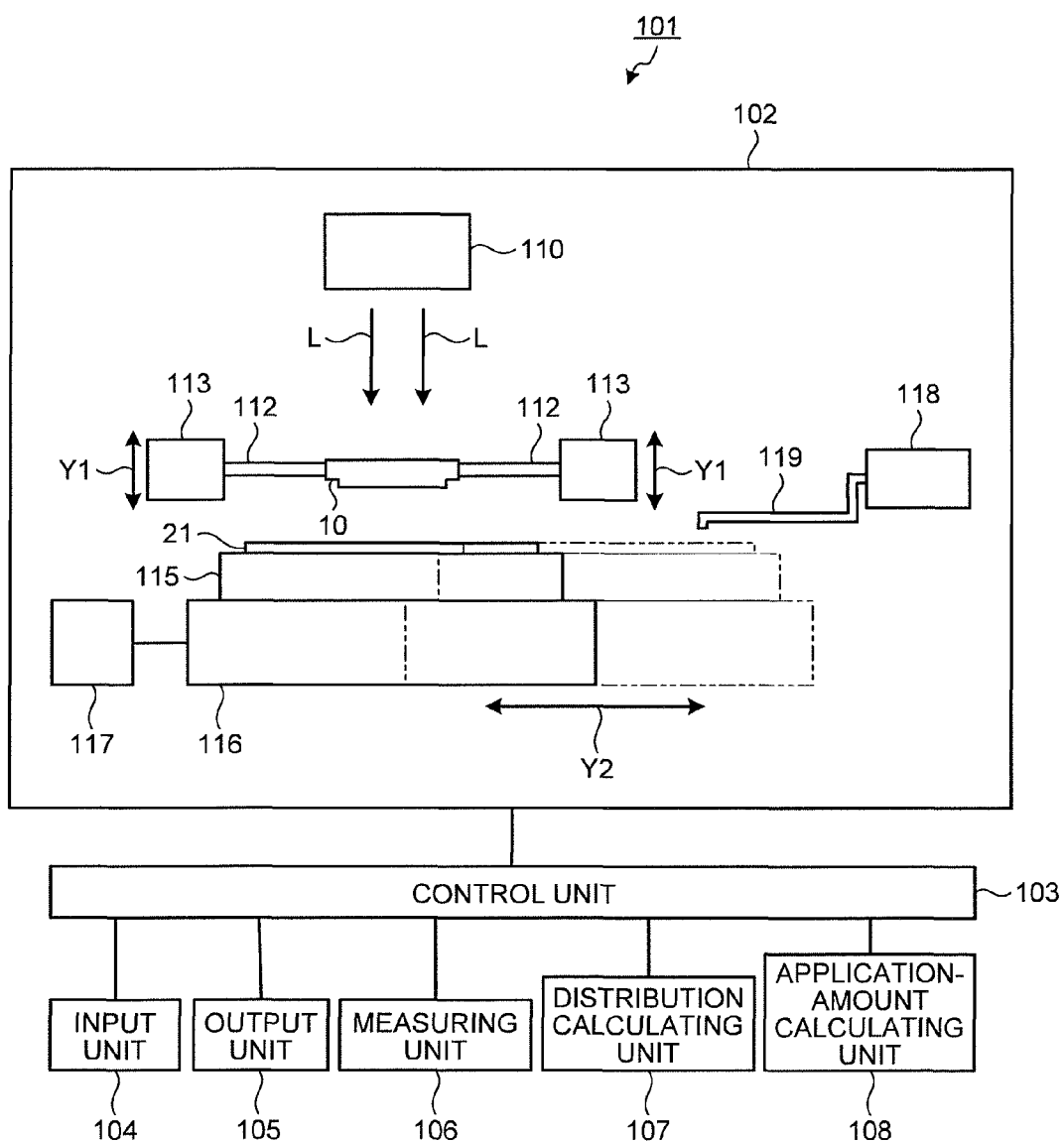
FIG. 2 is a diagram schematically illustrating one example of a configuration of a nanoimprint apparatus according to a first embodiment.

FIG. 2 is a diagram schematically illustrating one example of a configuration of a nanoimprint apparatus according to the first embodiment. As shown in FIG. 2, a nanoimprint apparatus 101 according to the first embodiment includes a nanoimprint mechanism 102, a control unit 103, an input unit 104, an output unit 105, a measuring unit 106, a distribution calculating unit 107, and an application-amount calculating unit 108. The nanoimprint apparatus 101 is a nanoimprint apparatus in which template conveying, substrate conveying, alignment, transfer, and the like are automated for improving accuracy in a series of operations in microfabrication in a semiconductor manufacturing process.

The nanoimprint mechanism 102 performs a pattern transfer onto a substrate 21 that is a sample by the nanoimprint technology using the template 10. The nanoimprint mechanism 102 includes a light source 110, the template 10, template holding units 112, lift mechanisms 113, a substrate holding unit 115, a substrate moving mechanism 116, a substrate-movement driving unit 117, a container 118, and an application mechanism 119.

The light source 110 emits ultraviolet light L by which a photo-curing agent is cured. The template holding units 112 hold the template 10. The lift mechanisms 113 are provided to correspond to the template holding units 112, respectively, and raise and lower the template 10 in an up-and-down direction (direction of arrows Y1 in FIG. 2) by raising and lowering the template holding units 112. The substrate holding unit 115 holds the substrate 21. The substrate moving mechanism 116 moves the substrate 21 in a horizontal direction (direction of an arrow Y2 in FIG. 2) by moving the substrate holding unit 115. The substrate-movement driving unit 117 drives the substrate moving mechanism 116. The container 118 holds a photo-curing agent to be applied to the surface of the substrate 21. The application mechanism 119 applies the photo-curing agent in the container 118 to a shot of a pattern transfer target in the substrate 21. The template holding units 112 hold the template 10 so that the formation surface of the projection and recess pattern 11p of the template 10 faces the pattern formation target surface of the substrate 21 in parallel.

The control unit 103 controls the operation process of each configuration unit of the nanoimprint apparatus 101. The input unit 104 inputs instruction information on the process operation of the nanoimprint apparatus 101. The output unit 105 outputs the process information on the nanoimprint apparatus 101.

The measuring unit 106 measures a shape parameter for evaluating uniformity of the shape of the projection and recess pattern 11p of the template 10. The measuring unit 106 measures a recess portion dimension, a sidewall angle, and an engraving amount in the projection and recess pattern 11p as the shape parameters. The recess portion dimension is a width of the upper portion of the recess portion of the projection and recess pattern 11p. The sidewall angle is an angle formed by the sidewall surface of the recess portion of the projection and recess pattern 11p and the main surface of the template 10. The engraving amount is a depth of the recess portion of the projection and recess pattern 11p. The distribution calculating unit 107 calculates distribution information representing the distribution of the shape of the projection and recess pattern 11p based on the measurement result of the parameter in the measuring unit 106. The application-amount calculating unit 108 calculates the droplet amount of the photo-curing agent to each position onto a processing target layer based on the calculation result in the distribution calculating unit 107.

Next, a nanoimprint method and a processing method using the nanoimprint apparatus 101 are explained. First, the measuring unit 106 measures the recess portion dimension of the recess portion of the projection and recess pattern 11p as the shape parameter. Then, the distribution calculating unit 107 calculates the distribution information on the recess portion dimension of the projection and recess pattern 11p based on the measurement result in the measuring unit 106.

Figure 3:
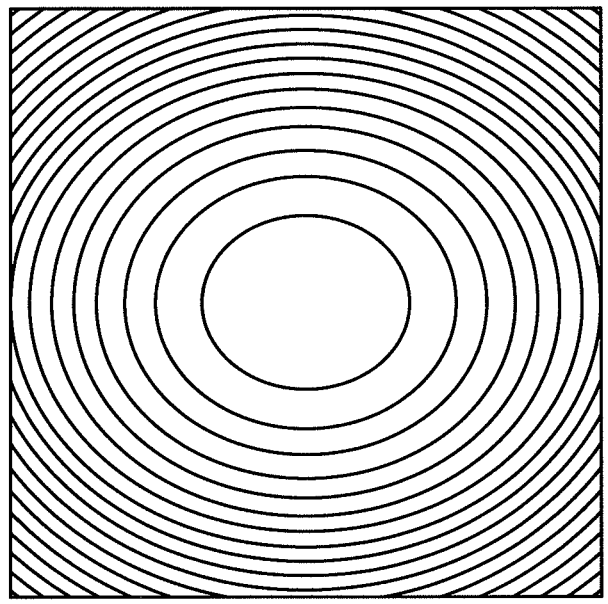
FIG. 3 is a diagram illustrating one example of distribution information on a recess portion dimension in a pattern area surface in the first embodiment.

FIG. 3 is a diagram illustrating one example of the distribution information on the recess portion dimension in the surface of the pattern area PA calculated by the distribution calculating unit 107 based on the measurement result of the recess portion dimension of the projection and recess pattern 11p in the measuring unit 106. In FIG. 3, a width of an ellipse or an elliptical ring-shaped area indicates the recess portion dimension. In the example shown in FIG. 3, the recess portion dimension in the surface of the pattern area PA has a concentric distribution. In other words, the width of the recess portion (space) in the L/S projection and recess pattern 11p is wide in the central area in the surface of the pattern area PA and is gradually narrowed toward the outside. The recess portion becomes a projection portion on the substrate 21 on which a pattern is formed by the NIL using this template 10.

On the other hand, the distribution information on the sidewall angle and the distribution information on the engraving amount in the surface of the pattern area PA are obtained in the similar manner to FIG. 3 based on the measurement result of the sidewall angle and the engraving amount of the projection and recess pattern 11p formed on the quartz substrate 11 (not shown). For the sidewall angle and the engraving amount, the distribution in the surface of the pattern area PA is relatively uniform. Therefore, it is estimated that the dimension distribution in the surface of the pattern area PA is attributed to the development process after the EB writing. In other words, the dimension variation of the sidewall angle and the engraving amount depends on the anisotropic etching process (see FIG. 1E) of the quartz substrate 11 with the Cr film pattern 12p as an etching mask. If the distribution of the sidewall angle and the engraving amount is relatively constant, variation (distribution) in recess portion dimension of the projection and recess pattern 11p is estimated to be caused by the development after the EB writing.

Next, the application-amount calculating unit 108 calculates the droplet amount of the photo-curing agent at each position in one shot (single imprint area) to the processing target layer on which a pattern is formed by the NIL, based on the shape information (distribution information on the shape parameter), and determines application amount information (distribution information) that is information on the droplet amount of the photo-curing agent. The application-amount calculating unit 108 can determine the application amount information (distribution information) based on the shape distribution information (distribution information on the shape parameter) on the projection and recess pattern 11p by pre-storing correspondence information on the type of a photo-curing agent 23, the shape of the projection and recess pattern 11p, the material of the processing target layer, conditions such as an etching condition of the processing target layer, and the droplet amount of the photo-curing agent.

Figure 4:
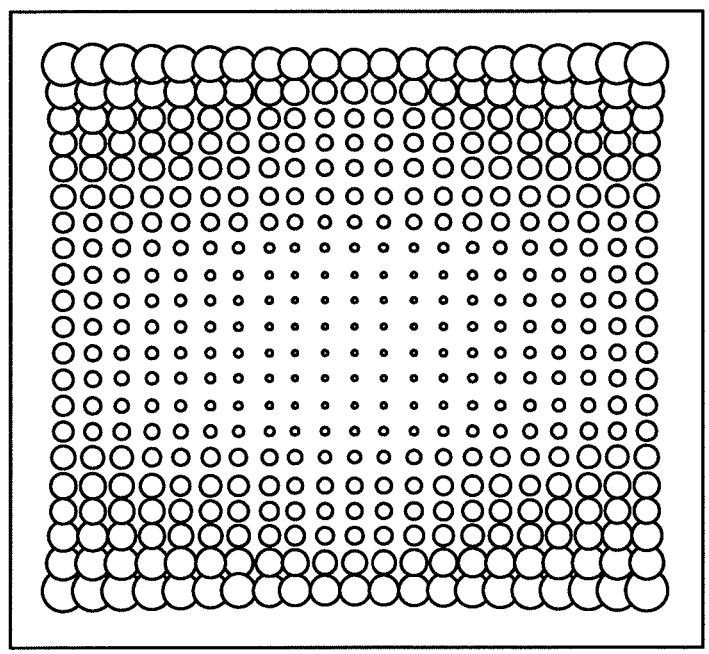
FIG. 4 is a diagram illustrating one example of a distribution of a droplet amount (application amount) of a photo-curing agent in one shot onto a processing target layer in the first embodiment.

FIG. 4 is a diagram illustrating one example of the application amount information (distribution information) calculated by the application-amount calculating unit 108 based on the distribution information on the recess portion dimension calculated by the distribution calculating unit 107. FIG. 4 illustrates application-amount distribution information indicating the distribution of the droplet amount of the photo-curing agent corresponding to the distribution of the recess portion dimension illustrated in FIG. 3, in which the size of a circle indicates the droplet amount of the photo-curing agent. In the example shown in FIG. 4, the droplet amount of the photo-curing agent is determined to be small in the central portion in one shot and becomes gradually larger toward the outside. In other words, the droplet amount of the photo-curing agent has a concentric distribution corresponding to the distribution of the dimension illustrated in FIG. 3. In the present embodiment, the droplet amount of the photo-curing agent is small in a portion in which the recess portion dimension in the projection and recess pattern 11p is large and is large in a portion in which the recess portion dimension in the projection and recess pattern 11p is small. Consequently, the RLT in the subsequent process can be intentionally controlled.

Next, the template 10 is held by the template holding units 112 and the template holding units 112 are raised and lowered by using the lift mechanisms 113 to arrange the template 10 at a predetermined standby position. Moreover, the substrate 21 is held by the substrate holding unit 115 and the substrate holding unit 115 is moved by using the substrate moving mechanism 116 to arrange the substrate 21 at a predetermined position. Then, the application mechanism 119 applies the photo-curing agent 23 in one shot on a processing target layer 22 on the substrate 21 held by the substrate holding unit 115 based on the application amount information (distribution information) by the control of the control unit 103. The photo-curing agent 23 is applied such that the application amount is small in the central portion in the pattern area PA and becomes larger toward the outside based on the above-described application amount information (distribution information).

Figure 5A:
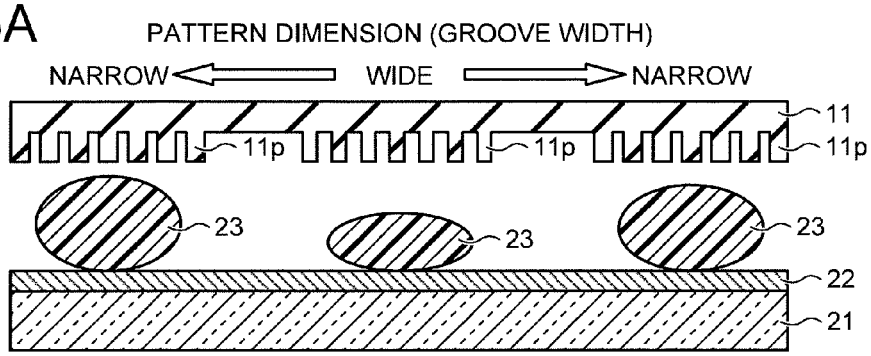
FIG. 5A to FIG. 5F are cross-sectional views schematically illustrating an imprint method and a processing method using the nanoimprint apparatus according to the first embodiment.

Next, the substrate moving mechanism 116 moves the substrate holding unit 115 to arrange the substrate 21 at a predetermined position so that the formation surface of the projection and recess pattern 11p faces the pattern formation target surface of the substrate 21 in parallel (FIG. 5A). FIG. 5A to FIG. 5F are cross-sectional views schematically illustrating the imprint method and the processing method using the nanoimprint apparatus 101.

Figure 5B:
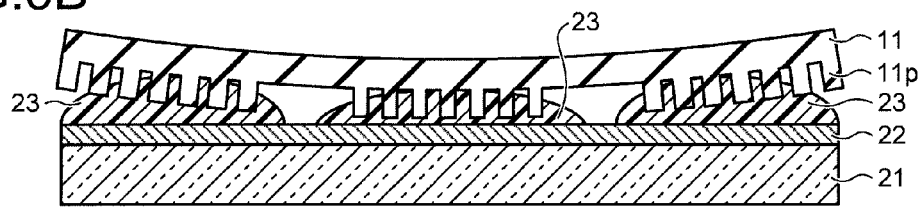

Next, the template 10 is lowered as indicated by the arrows Y1 by lowering the template holding units 112 by the lift mechanisms 113, whereby the formation surface of the projection and recess pattern 11p of the template 10 is brought into contact with the photo-curing agent 23 on the processing target layer 22 on the substrate 21 (FIG. 5B). After the template 10 comes into contact with the photo-curing agent 23, the driving of the lift mechanisms 113 is released and the template 10 is lowered by its own weight. When the template 10 is moved closer to the photo-curing agent 23, the photo-curing agent 23 enters into the projection and recess pattern 11p of the template 10 by capillary action. In this process, the template 10 is warped in accordance with the droplet amount of the photo-curing agent 23 to ensure an equilibrium state between the lowering of the template 10 by gravity and an upward force of the photo-curing agent 23 by capillary action at each position as illustrated in FIG. 5B.

Figure 5C:
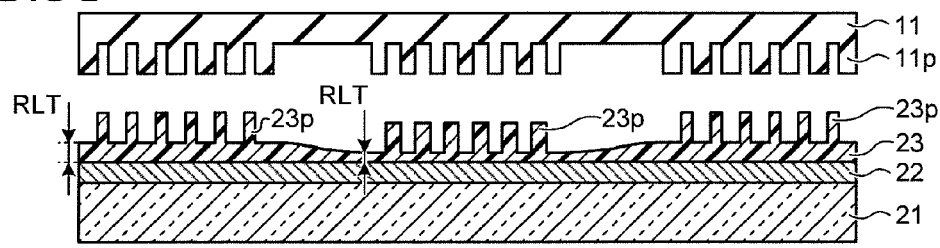

In this state, the photo-curing agent 23 is irradiated with the ultraviolet light L via the template 10 by the light source 110, so that the photo-curing agent 23 is cured. After the photo-curing agent 23 is sufficiently cured to become resist, the lift mechanisms 113 raise the template holding units 112 to raise the template 10 (FIG. 5C). Consequently, an L/S resist pattern 23p on which the shape of the projection and recess pattern 11p of the template 10 is transferred is formed on the processing target layer 22 of the substrate 21. The resist remains also in the recess portion (space) of the resist pattern 23p. In the film thickness (RLT) of the residual portion of the recess portion (space) of this resist pattern 23p, the distribution of the RLT occurs in an in-plane direction of the substrate 21. The RLT becomes thick in the outside area in one shot in which the droplet amount of the photo-curing agent 23 is large. On the other hand, the RLT becomes thin in the inside (central) area in one shot in which the droplet amount of the photo-curing agent 23 is small. Therefore, the height of the projection portion of the resist pattern 23p from the surface of the processing target layer 22 becomes large in the outside area in one shot compared to the inside (central) area in one shot by the difference of the RLT.

Figure 5D:
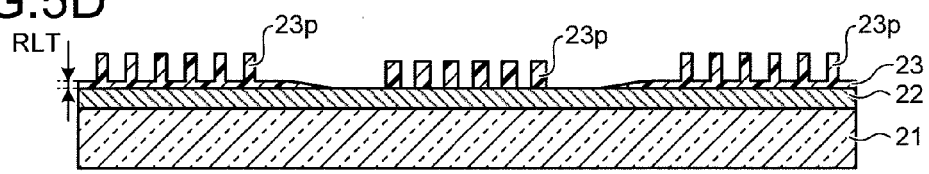

Next, the substrate 21 is conveyed from the nanoimprint apparatus 101 and the anisotropic etching, for example, by a dry etching is performed on the processing target layer 22 with the resist pattern 23p as an etching mask. In the initial stage of the anisotropic etching, in the inside (central) area in one shot in which the RLT is thin, the resist pattern 23p is etched and thus the height thereof becomes low. The residual portion of the recess portion of the resist pattern 23p is eliminated by etching. Moreover, in the outside area in one shot in which the RLT is thick, the resist pattern 23p is etched and thus the height thereof becomes low, and the residual portion of the recess portion of the resist pattern 23p is etched and thus the RLT becomes thin, however, the residual portion remains (FIG. 5D).

Figure 5E:
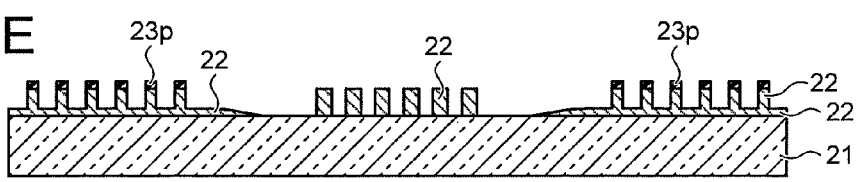

When etching further proceeds, in the inside (central) area in one shot in which the RLT is thin, the anisotropic etching is performed on the processing target layer 22 with the resist pattern 23p as an etching mask, whereby the processing target layer 22 is processed into a shape in which the pattern of the resist pattern 23p is transferred. At this point of time, in the inside (central) area in one shot in which the RLT is thin, the recess portion of the pattern of the processing target layer 22 is etched and is eliminated. Moreover, in the outside area in one shot in which the RLT is thick, the anisotropic etching is performed on the processing target layer 22 with the resist pattern 23p as an etching mask, whereby the processing target layer 22 is processed into a shape in which the pattern of the resist pattern 23p is transferred. At this point of time, in the outside area in one shot in which the RLT is thick, the resist pattern 23p remains and the recess portion of the pattern of the processing target layer 22 still remains (FIG. 5E).

Figure 5F:

When etching further proceeds, in the inside (central) area in one shot in which the RLT is thin, etching to the processing target layer 22 proceeds in a lateral direction and the processing target layer 22 is processed until the width of the pattern thereof becomes thin to a predetermined width. Moreover, in the outside area in one shot in which the RLT is thick, the processing target layer 22 is processed into a shape in which the pattern of the resist pattern 23p is transferred and the recess portion of the pattern of the processing target layer 22 is eliminated (FIG. 5F). Consequently, in the inside (central) area in one shot and the outside area in one shot, a processing target layer pattern 22p having a uniform dimension same as the dimension of the resist pattern 23p in the outside area in one shot is obtained. In this manner, in the inside (central) area in one shot, a processing conversion difference (difference between the dimension of the resist pattern 23p and the dimension of the processing target layer pattern 22p after processing) becomes large. In other words, although the processing conversion difference is different depending on the inside (central) area in one shot in accordance with the RLT, the dimension of the processing target layer pattern 22p after processing finally becomes a uniform dimension same as the dimension of the resist pattern 23p in the outside area in one shot as illustrated in FIG. 5F.

The RLT is considered to largely depend on the droplet amount of the photo-curing agent and the pattern coverage. When the pattern coverage is the same, the RLT becomes thick as the droplet amount becomes large, and when the droplet amount is the same, the RLT becomes thin as the coverage (area in which the photo-curing agent needs to be dropped) is high. Typically, in the case of dropping the photo-curing agent by the inkjet method, a head including a plurality of droplet portions that can be individually controlled is used. When the coverage changes in the surface of the template, the droplet amount is adjusted for each location to uniform the RLT.

However, in the above described first embodiment, in one shot of the processing target layer 22, in the area corresponding to the portion (portion in which the projection portion of the resist pattern 23p becomes wide) in which the width of the recess portion (space) in the projection and recess pattern 11p is wide, the droplet amount of the photo-curing agent 23 is reduced to thin the RLT. Moreover, in one shot in the processing target layer 22, in the area corresponding to the portion (portion in which the projection portion of the resist pattern 23p becomes narrow) in which the width of the recess portion (space) in the projection and recess pattern 11p is narrow, the droplet amount of the photo-curing agent 23 is increased to thicken the RLT.

In the area (portion in which the projection portion of the resist pattern 23p becomes wide) in which the RLT is thin, after etching of the processing target layer 22 proceeds and the RLT is eliminated, the etching proceeds in a lateral direction on the projection pattern of the processing target layer 22 and the projection pattern of the processing target layer 22 is processed so that the width thereof become a predetermined width. Therefore, it is possible to process the resist pattern 23p that is formed wide to be thin and finish the resist pattern 23p to have a width same as the resist pattern 23p that is formed narrow. It is possible to set so that the width of the resist pattern 23p that is formed wide and the width of the resist pattern 23p that is formed narrow are the same at the time when processing of the resist pattern 23p that is formed narrow is finished by pre-storing the correspondence information on the type of the photo-curing agent 23, the shape of the projection and recess pattern 11p, the material of the processing target layer 22, conditions such as the etching condition of the processing target layer 22, and the droplet amount of the photo-curing agent and setting an appropriate RLT based thereon.

According to the above described first embodiment, the resist pattern 23p is formed so that the RLT is intentionally made different for each area in one shot of the processing target layer 22 by adjusting the application amount of the photo-curing agent 23 for each area in one shot based on the shape distribution of the projection and recess pattern 11p formed on the template 10. Consequently, it becomes possible to control the processing conversion difference for each area in one shot of the processing target layer 22, i.e., difference between the dimension of the resist pattern 23p and the dimension of the processing target layer pattern 22p after processing and to form the processing target layer pattern 22p having a uniform dimension in the whole area in one shot.

In the above explanation, the case of using one template 10 is explained, however, actually, a plurality of the templates 10 is held by the template holding units 112 to correspond to the whole surface of the processing target layer 22. Moreover, in the similar manner to the normal photolithography, the nanoimprint is repeated by the step and repeat.

Moreover, it is applicable to process the substrate 21 of the lower layer by using the processing target layer pattern 22p formed in the first embodiment. Consequently, it is possible to form a pattern having a uniform dimension on the substrate 21 in the whole area of one shot.

(Second Embodiment)

In the second embodiment, the case is explained in which each of the recess portion dimension and the engraving amount among the shape parameters has an approximately uniform distribution in the surface of the pattern area PA and the sidewall angle has a distribution in the surface of the pattern area PA. A series of processes from the manufacturing of the template 10 to the processing of the processing target layer 22 are basically the same as the first embodiment. Therefore, only characteristic portions of the second embodiment are explained below.

Figure 6:
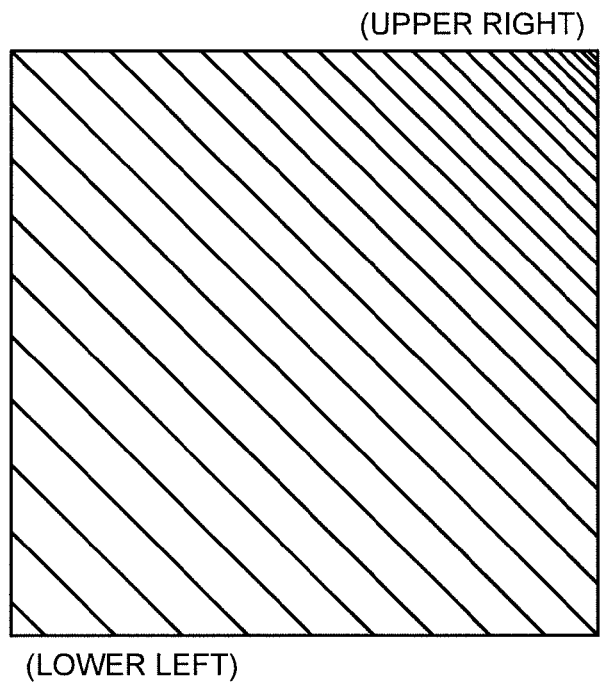
FIG. 6 is a diagram illustrating one example of distribution information on a sidewall angle in a pattern area surface according to a second embodiment.

FIG. 6 is a diagram illustrating one example of the distribution information on the sidewall angle in the surface of the pattern area PA calculated by the distribution calculating unit 107 based on the measurement result of the sidewall angle of the projection and recess pattern 11p by the measuring unit 106. In FIG. 6, the width between diagonal lines indicates a degree of a sidewall angle α. Moreover, FIG. 6 illustrates the distribution of the state same as the state in which the template 10 is set in the nanoimprint apparatus 101, i.e., the distribution of the state when viewed from the opposite side of the surface on which the projection and recess pattern 11p is formed. In FIG. 6, the difference in thickness of the width between diagonal lines is emphatically illustrated for easy understanding. In the example shown in FIG. 6, the sidewall angle α is 90° in the lower left area in the surface of the pattern area PA and is 80° in the upper right area in the surface of the pattern area PA, and the distribution is such that the sidewall angle α becomes small toward the upper right area from the lower left area in the surface of the pattern area PA. The recess portion becomes a projection portion on the substrate 21 on which a pattern is formed by the NIL using this template 10.

The application-amount calculating unit 108 calculates the droplet amount of the photo-curing agent 23 at each position in one shot onto the processing target layer 22 based on the shape distribution information (distribution information on the shape parameter) and determines the application amount information (distribution information) that is information on the droplet amount of the photo-curing agent 23.

Figure 7:
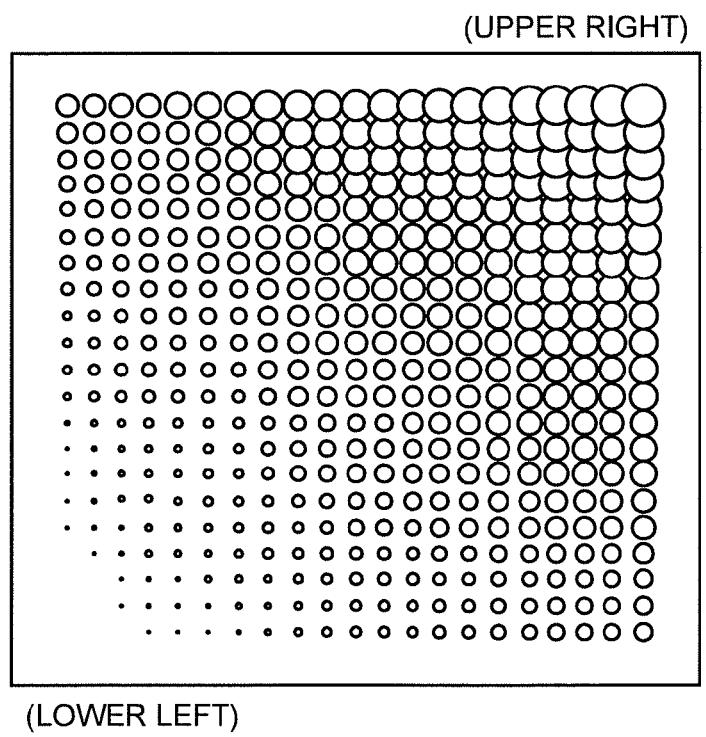
FIG. 7 is a diagram illustrating one example of a distribution of a droplet amount (application amount) of a photo-curing agent in one shot onto a processing target layer in the second embodiment.

FIG. 7 is a diagram illustrating one example of the application amount information (distribution information) calculated by the application-amount calculating unit 108 based on the distribution information on the sidewall angle calculated by the distribution calculating unit 107. FIG. 7 illustrates application-amount distribution information indicating the distribution of the droplet amount of the photo-curing agent 23 corresponding to the distribution of the sidewall angle illustrated in FIG. 6, in which the size of a circle indicates the droplet amount of the photo-curing agent 23. In the example in FIG. 7, the droplet amount of the photo-curing agent 23 is determined to be small in the lower left portion in one shot and becomes larger toward the upper right side. In other words, the droplet amount of the photo-curing agent 23 has a distribution corresponding to the distribution of the sidewall angle illustrated in FIG. 6.

Figure 8A:
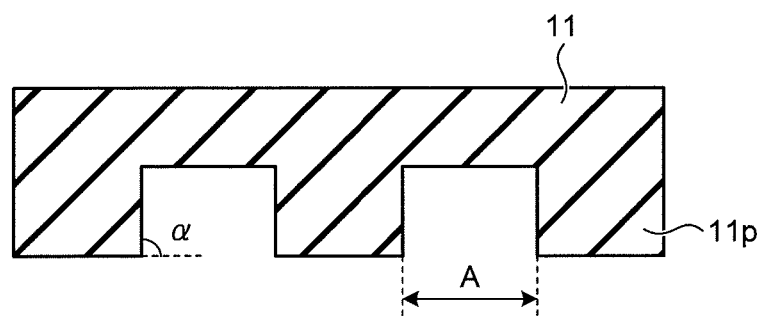
FIG. 8A and FIG. 8B are schematic diagrams explaining a shape of a projection and recess pattern on a template in the second embodiment.
Figure 8B:
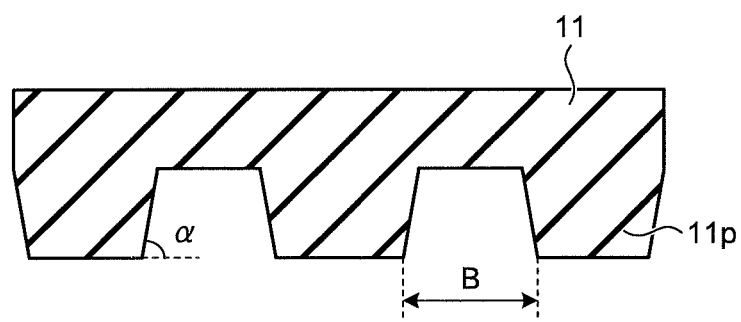

FIG. 8A and FIG. 8B are schematic diagrams illustrating the shape of the projection and recess pattern 11p on the template 10. As shown in FIG. 8A, in the lower left area in the surface of the pattern area PA, the sidewall angle α is 90°. As shown in FIG. 8B, in the upper right area in the surface of the pattern area PA, the sidewall angle α is 80°. Moreover, a recess portion dimension A of the projection and recess pattern 11p in the lower left area in the surface of the pattern area PA illustrated in FIG. 8A and a recess portion dimension B of the projection and recess pattern 11p in the upper right area in the surface of the pattern area PA illustrated in FIG. 8B are the same.

Figure 9A:
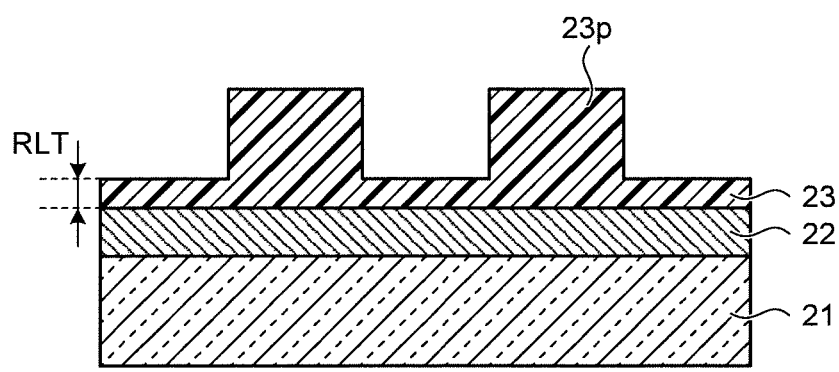
FIG. 9A and FIG. 9B are cross-sectional views illustrating a state where a resist pattern is formed on the processing target layer in the second embodiment.
Figure 9B:
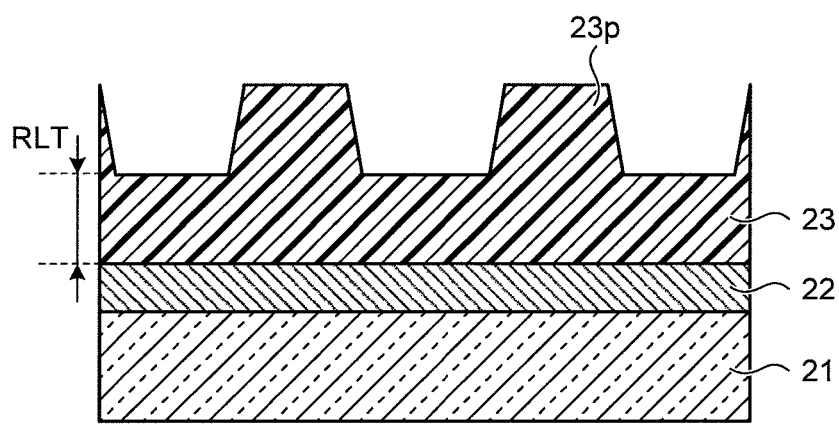

FIG. 9A and FIG. 9B are cross-sectional views illustrating the state where the resist pattern 23p is formed on the processing target layer 22 of the substrate 21, which corresponds to the process in FIG. 5C. FIG. 9A illustrates a cross section of the resist pattern 23p in the lower left area in one shot, which is formed by the projection and recess pattern 11p illustrated in FIG. 8A. FIG. 9B illustrates a cross section of the resist pattern 23p in the upper right area in one shot, which is formed by the projection and recess pattern 11p illustrated in FIG. 8B. In the lower left portion in one shot in which the droplet amount of the photo-curing agent 23 is small, the RLT is thin. On the other hand, in the upper right portion in one shot in which the droplet amount of the photo-curing agent 23 is large, the RLT is thick.

Figure 10A:
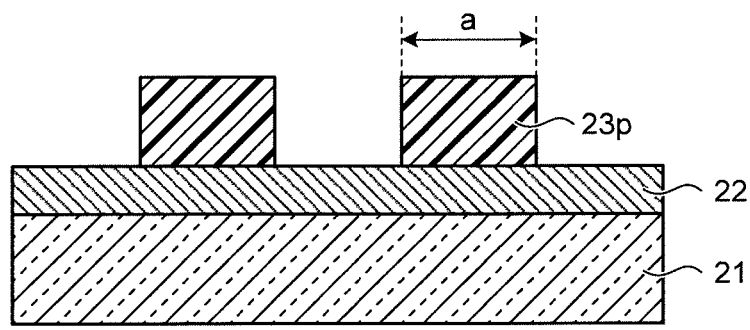
FIG. 10A and FIG. 10B are cross-sectional views illustrating an initial stage of an anisotropic etching to the processing target layer in the second embodiment.
Figure 10B:
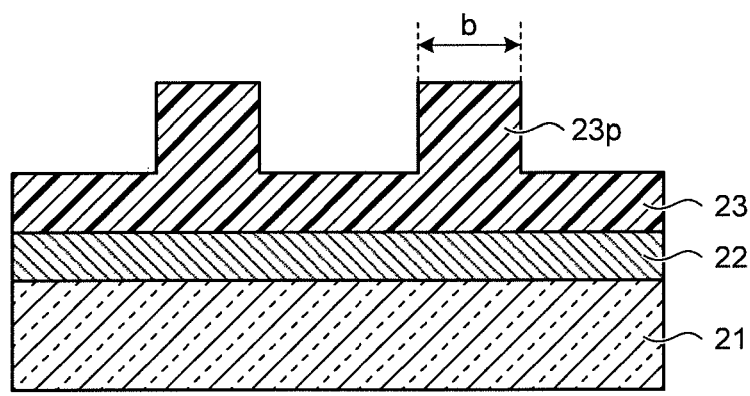

FIG. 10A and FIG. 10B are cross-sectional views illustrating an initial stage of the anisotropic etching to the processing target layer 22, which corresponds to the process in FIG. 5D. FIG. 10A illustrates a cross section of the resist pattern 23p in the lower left area in one shot, which corresponds to FIG. 9A. FIG. 10B illustrates a cross section of the resist pattern 23p in the upper right area in one shot, which corresponds to FIG. 9B.

When the anisotropic etching is performed, the etching proceeds in a lateral direction in the portion in the upper right portion in the pattern area PA in which the sidewall of the resist pattern 23p is tilted. Therefore, a projection portion dimension a of the resist pattern 23p illustrated in FIG. 10A and a projection portion dimension b of the resist pattern 23p illustrated in FIG. 10B do not become the same. In other words, the projection portion dimension b illustrated in FIG. 10B becomes smaller than the projection portion dimension a illustrated in FIG. 10A, and thus a large processing conversion difference is generated.

On the other hand, in the lower left portion in the pattern area PA in which the RLT is thin, etching proceeds in a lateral direction as the anisotropic etching proceeds in the similar manner to the first embodiment and the processing target layer 22 is processed until the width of the pattern thereof becomes thin to a predetermined width, so that a large processing conversion difference is generated. Therefore, finally, the dimension of the processing target layer pattern 22p after processing becomes uniform in the lower left area and the upper right area in one shot in the similar manner to the first embodiment.

According to the above described second embodiment, the resist pattern 23p is formed so that the RLT is intentionally made different for each area in one shot of the processing target layer 22 by adjusting the application amount of the photo-curing agent 23 for each area in one shot based on the shape distribution of the projection and recess pattern 11p formed on the template 10 in the similar manner to the first embodiment. Consequently, it becomes possible to control the processing conversion difference for each area in one shot of the processing target layer 22, i.e., difference between the dimension of the resist pattern 23p and the dimension of the processing target layer pattern 22p after processing and therefore to form the processing target layer pattern 22p having a uniform dimension in the whole area in one shot.

Moreover, it is applicable to process the substrate 21 on the lower layer by using the processing target layer pattern 22p formed in the second embodiment. Consequently, it is possible to form a pattern having a uniform dimension on the substrate 21 in the whole area of one shot.

(Third Embodiment)

Figure 11:
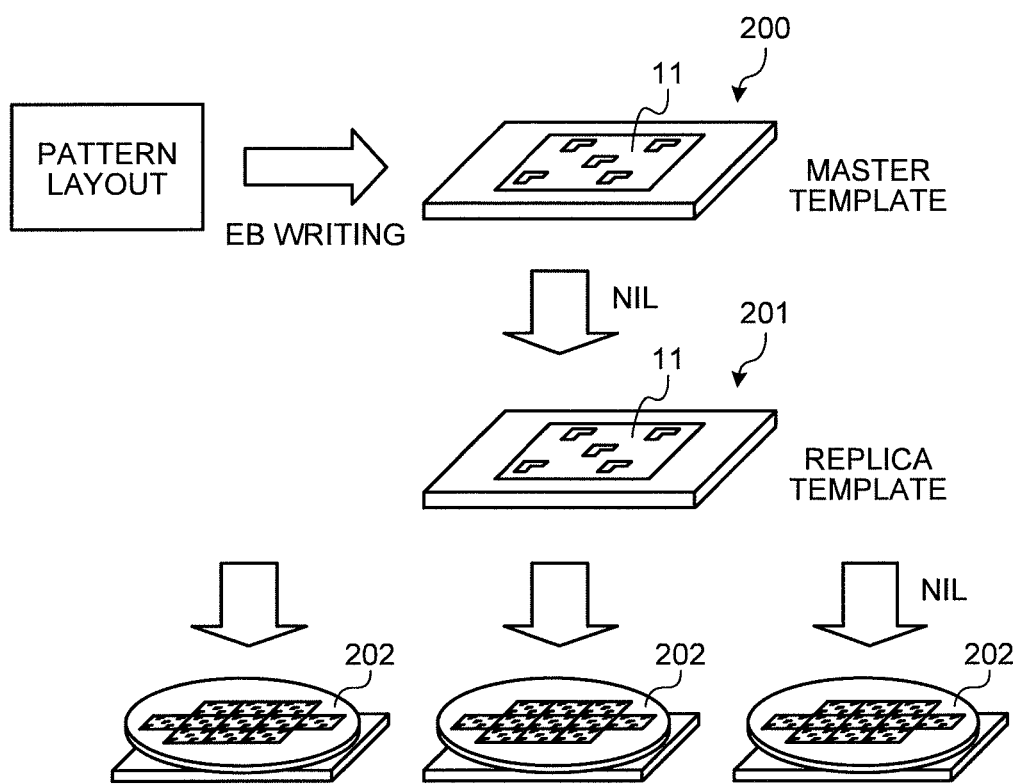
FIG. 11 is a diagram schematically illustrating a flow of performing a pattern formation of a process target substrate by an NIL using a master template and a replica template according to a third embodiment.

FIG. 11 is a diagram schematically illustrating a flow of performing a pattern formation of a process target substrate by the NIL using a master template and a replica template according to the third embodiment. In the above described first embodiment and second embodiment, the method is illustrated in which the processing target layer pattern 22p whose dimension is uniform in all area in one shot is obtained by adjusting the RLT at the time of the pattern transfer to the processing target layer 22 from the template 10.

In the nanoimprint method, the life of the template is limited. Therefore, a method is known in which, first, a master template 200 is manufactured in advance as illustrated in FIG. 11, a replica template 201 is manufactured from the master template 200 by the imprint method, and the pattern formation of a process target substrate 202 is performed by using this replica template 201.

However, variation in pattern dimension on the template occurs also in the master template 200. Therefore, when manufacturing the replica template 201 from the master template 200, the RLT is adjusted in the similar manner to the first embodiment and the second embodiment, so that the high quality replica template 201 on which the processed pattern having a uniform dimension is formed in the pattern area surface can be manufactured. Then, the nanoimprint is performed by using this replica template 201, so that the processing target layer pattern having a uniform dimension can be obtained. Moreover, in this case, it is applicable to adjust the RLT again and perform the nanoimprint.

(Fourth Embodiment)

In the above described first embodiment and second embodiment, the shape distribution information (distribution information on the shape parameter) on the template 10 that is obtained in advance is reflected in the recipe generation of the droplet amount of the photo-curing agent 23, which can be called a feedforward control.

Figure 12:
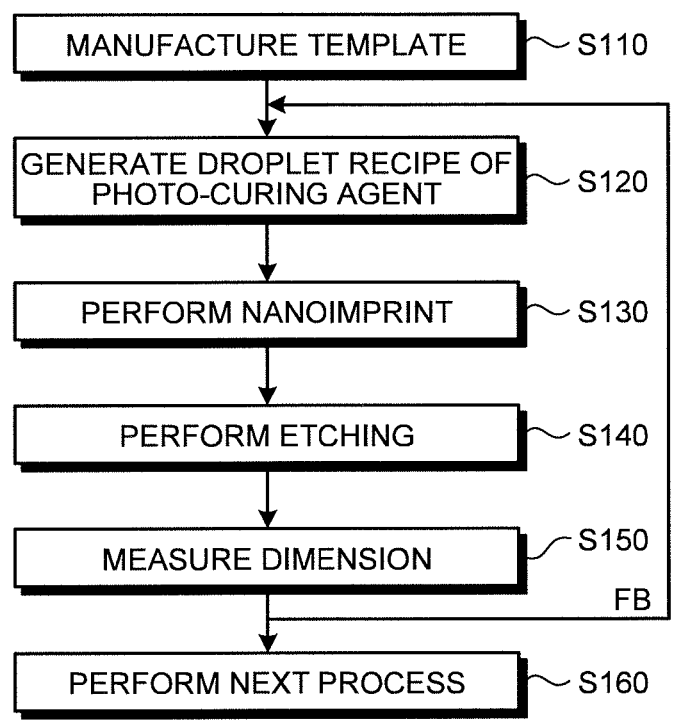
FIG. 12 is a flowchart illustrating a flow of a feedback control using shape distribution information (distribution information on a shape parameter) on a template according to a fourth embodiment.

On the other hand, it is also possible to perform a feedback control of actually measuring the dimension of the processed pattern formed on the process target substrate 202 as illustrated in FIG. 12 and changing the recipe of the droplet amount of the photo-curing agent so that the dimension variation of the processed pattern is eliminated based on this actually-measured dimension of the processed pattern. FIG. 12 is a flowchart illustrating a flow of the feedback control using the shape distribution information (distribution information on the shape parameter) of the template 10.

Specifically, first, the template manufacturing process as explained in the first embodiment is performed (Step S110). Next, as explained in the first embodiment and the second embodiment, the droplet recipe of the photo-curing agent is generated based on the shape distribution information on the template 10 (Step S120). Next, the nanoimprint as explained in the first embodiment is performed (Step S130). Next, etching of the processing target layer as explained in the first embodiment is performed (Step S140).

Next, the dimension of the processed pattern of the formed processing target layer is measured (Step S150). Then, returning to Step S120, the recipe of the droplet amount of the photo-curing agent is generated again based on this measured dimension of the processed pattern so that the dimension variation from the design dimension of the processed pattern is eliminated. For the substrate on which the nanoimprint is, performed thereafter, after Step S140, the system control can proceed to the next process without performing the dimension measurement at Step S150 (Step S160).

The processed pattern having a uniform dimension can be formed even by performing such feedback control in the similar manner to the first embodiment and the second embodiment. In this case, it is possible to suppress the dimension variation in not only a shot but also between shots. In other words, in this case, it is sufficient that the droplet amount distribution in the template is changed for each shot.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A processing method comprising:
measuring a recess portion shape of a first projection and recess pattern formed on a surface of a template;
calculating a distribution of the recess portion shape based on a measurement result of the recess portion shape;
calculating a distribution of an application amount of a curing agent to a first processing target layer based on the distribution of the recess portion shape;
applying the curing agent to the first processing target layer based on the distribution of the application amount of the curing agent to have a distribution of the application amount of the curing agent in a direction of the plane of the first processing target layer;
forming a second projection and recess pattern by transferring the first projection and recess pattern onto the curing agent by causing the curing agent to cure in a state where the first projection and recess pattern is in contact with the curing agent;
separating the first projection and recess pattern from the cured curing agent;
forming a third projection and recess pattern by processing the first processing target layer with the second projection and recess pattern as a mask; and
calculating a distribution of an application amount of a curing agent to a second processing target layer based on the distribution of a recess portion shape of the third projection and recess pattern.

2. The processing method according to claim 1, wherein the recess portion shape includes at least one of a width dimension of a recess portion of the first projection and recess pattern, a sidewall angle of a recess portion of the first projection and recess pattern, and a depth of a recess portion of the first projection and recess pattern.

3. The processing method according to claim 1, wherein the curing agent is a photo-curing agent.

* * * * *